(12) United States Patent
Chen

(10) Patent No.: US 7,037,122 B1
(45) Date of Patent: May 2, 2006

(54) CPU SOCKET MODULE AND PROTECTIVE CAP THEREOF

(75) Inventor: Huei-Ling Chen, Sindian (TW)

(73) Assignee: Giga-Byte Technology Co., Ltd., Taipei (TW)

( * ) Notice: Subject to any disclaimer, the term of this patent is extended or adjusted under 35 U.S.C. 154(b) by 0 days.

(21) Appl. No.: 11/084,093

(22) Filed: Mar. 21, 2005

(51) Int. Cl.
*H01R 13/44* (2006.01)

(52) U.S. Cl. ...................................... 439/135

(58) Field of Classification Search ................. 439/135, 439/910, 149, 940
See application file for complete search history.

(56) References Cited

U.S. PATENT DOCUMENTS

| | | | |
|---|---|---|---|
| 6,478,588 B1 * | 11/2002 | Howell et al. .............. 439/135 |
| 6,533,592 B1 * | 3/2003 | Chen et al. ................. 439/135 |
| 6,561,825 B1 * | 5/2003 | McHugh et al. ............ 439/135 |
| 6,821,127 B1 * | 11/2004 | Lin et al. ...................... 439/41 |
| 6,899,553 B1 * | 5/2005 | Ma et al. ..................... 439/135 |
| 6,905,353 B1 * | 6/2005 | Ma et al. ..................... 439/135 |

* cited by examiner

*Primary Examiner*—Phuong Dinh
(74) *Attorney, Agent, or Firm*—Rosenberg, Klein & Lee

(57) ABSTRACT

The present invention relates to a CPU socket module which includes a protective cap for protecting the socket. The socket includes an electric region for electronically connecting a CPU. The protective cap includes a frame and a transparent cover which can be torn off easily. Therefore, the protective cap prevents the consumer from touching the electric region of the socket and allows the consumer inspects the quality of the electric region of the socket.

13 Claims, 8 Drawing Sheets

CPU SOCKET MODULE AND PROTECTIVE CAP THEREOF

BACKGROUND OF THE INVENTION

1. Field of the Invention

The invention relates to the technology for protecting CPU sockets, and more particularly to a protective cap for a CPU socket.

2. Description of the Prior Art

Currently, CPU sockets are not protected well and easily damaged by consumers during purchasing. Furthermore, some of the consumers generally tend to refuse to take responsibilities of damages to the CPU sockets. The foregoing matters often lead to disputes between clerks and the consumers.

FIG. 7 shows a CPU 3, such as an Intel LGA775 CPU chip, and a CPU socket module 1, such as a Socket 775, which matches the CPU 3. A plurality of pins 1a provided on the Socket 775 for electronically connecting the corresponding contacts on the CPU 3. Because he CPU socket module 1 can be opened easily and the pins 1a are delicate and fragile, such dispute happens easily, the foregoing disputes happen easily.

SUMMARY OF THE INVENTION

Accordingly, the present invention discloses a CPU socket module which includes a socket and a protective cap. The socket further has an electric region for electronically connecting a CPU and the protective cap is provided for covering the socket. The protective cap includes a frame and a cover. Furthermore, the frame surrounds the electric region and includes a window formed for showing the electric region. The cover is provided within the window, transparent and able to be torn off.

Consumers cannot touch the electric region of the socket through the protective cap; therefore, the electric region of the socket is protected well. Meanwhile, since the protective cap is visible, the consumers are able to inspect the condition of the electric region so as to determine the quality of the socket. In particular, sellers are able to verify whether the consumers have touched or damaged the electric region of the socket via inspecting the completeness of the protective cap. For example, the sellers could inspect whether the cover has been torn off or the protective cap is remained in a proper position. Alternatively, a cheat-proof sticker is used to adhere to the frame and the cover in advance. Once the cheat-proof sticker is incomplete that means the cover has been opened.

For installing the CPU to the socket, it is convenient for a user to tear off the cover from the frame so as to expose the electric region of the socket.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
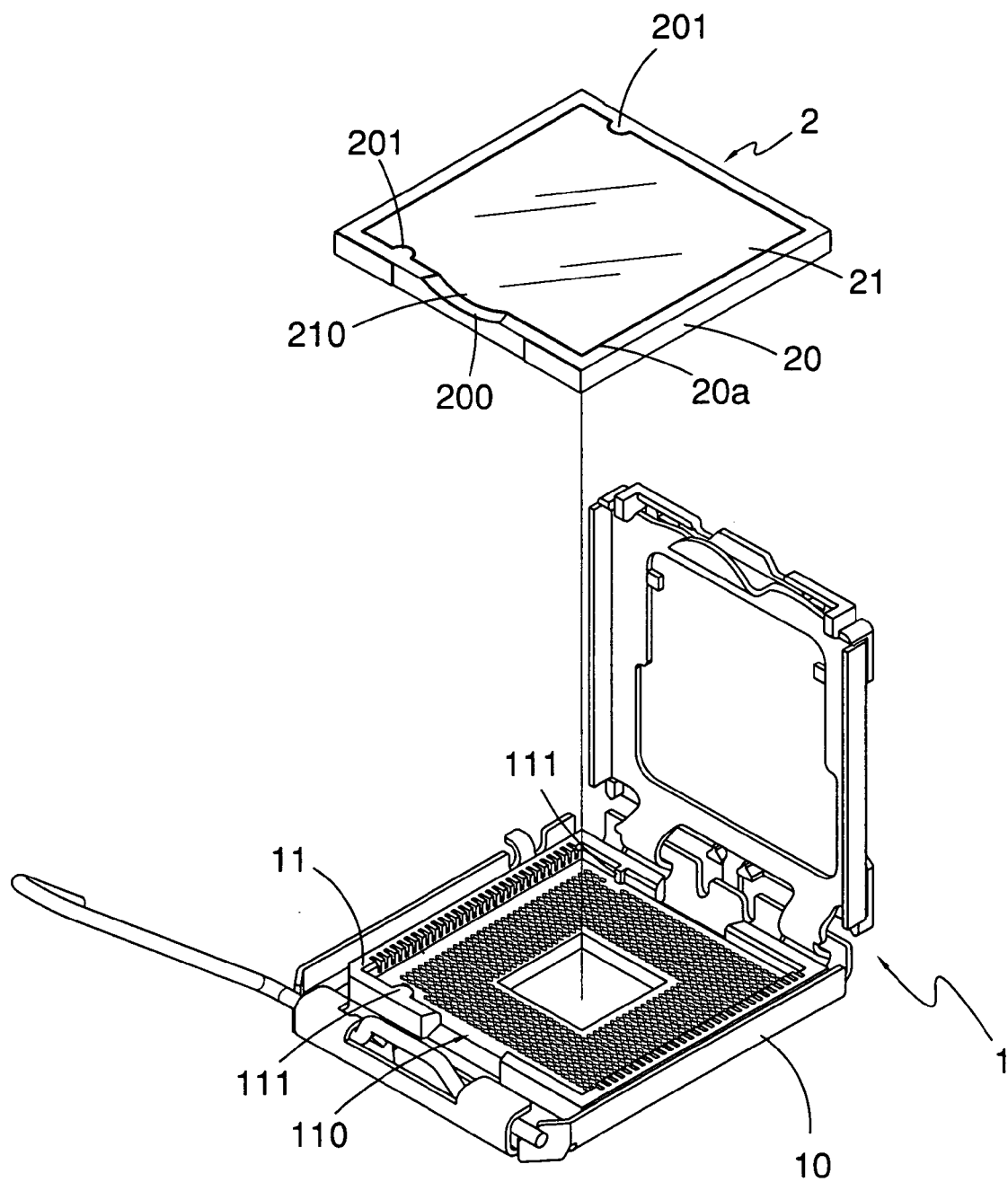
FIG. 1 shows the preferred embodiment of the present invention.

FIG. 1 shows a preferred embodiment of the present invention including a CPU socket module 1 supporting an Intel LGA775 CPU and a protective cap 2.

The CPU socket module 1 further includes a holder 10 and a socket 11 mounted in the holder 10. In addition, the socket 11 includes an electric region 110 having a plurality of pins thereon and two first foolproof protrusive blocks 111 which are opposite to each other and extend to be adjacent to the electric region 110.

The protective cap 2 further includes a frame 20 and a cover 21. The frame 20 surrounds the electric region 110 and has a window 20a formed for showing the electric region 110. The cover 21 is provided within the window 20a. In addition, the frame 20 comprises a notch 200 and the cover 21 includes a protrusive member 210 which is formed to a side of the cover 21 and faces the notch 200 for inserting into the notch 200. In addition, the frame 20 comprises two second foolproof protrusive blocks 201 which correspond to the first foolproof protrusive blocks 111. The dimensions of the second foolproof protrusive blocks 201 allow of covering the corresponding first foolproof protrusive blocks 111.

Figure 2:
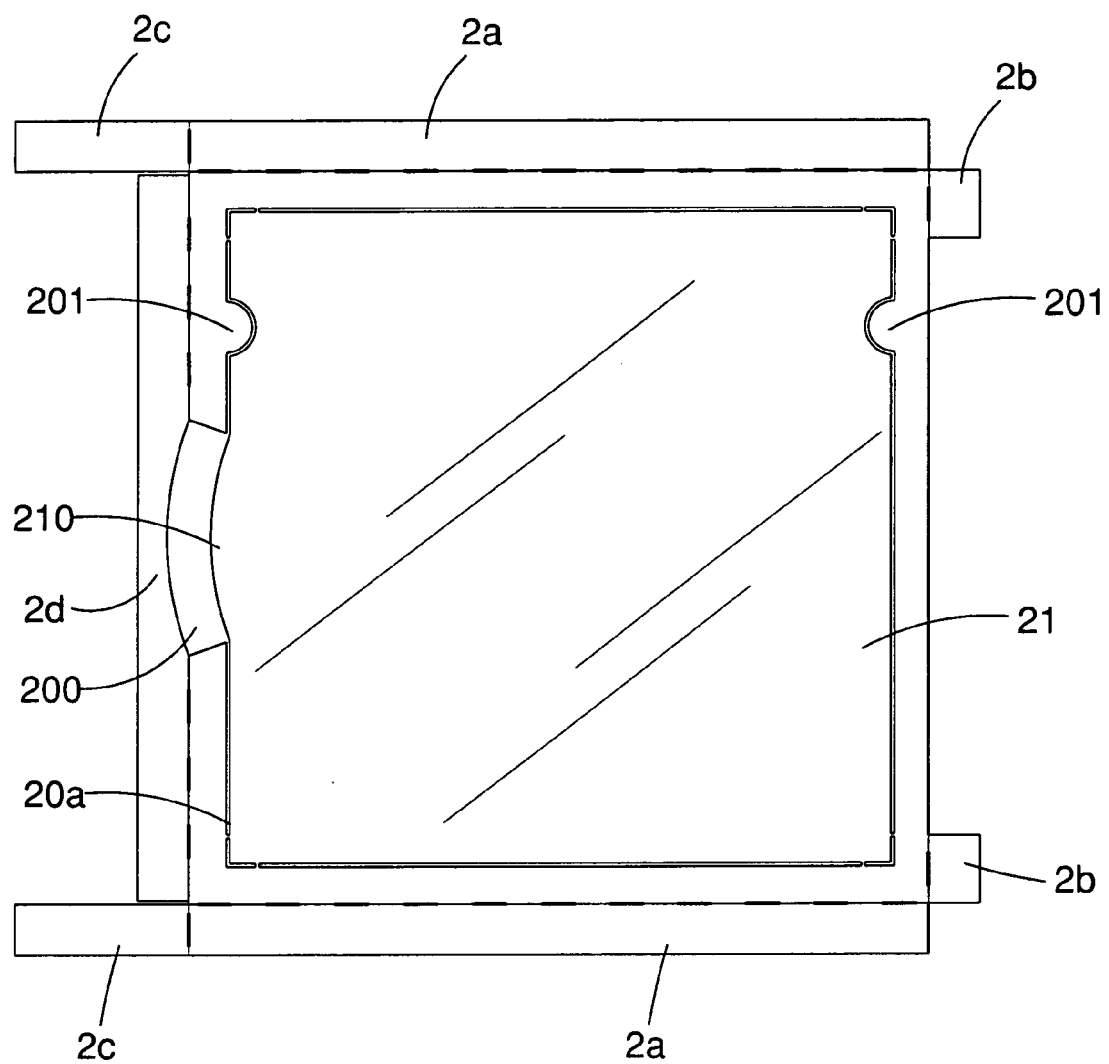
FIG. 2 shows a top-view depicting the protective cap of the present invention.

FIG. 2 shows an expanded protective cap 2 of the present invention. The expanded protective cap 2 is made of a transparent plastic sheet, which is pressed for forming the notch 200, the protrusive member 210 and the second protrusive foolproof blocks 201. Meanwhile, a plurality of foldable members 2a, 2b, 2c and 2d is formed as well after the press treatment; therefore, the frame 20 in FIG. 1 is formed after the foldable members 2a, 2b, 2c and 2d are folded.

Figure 3:
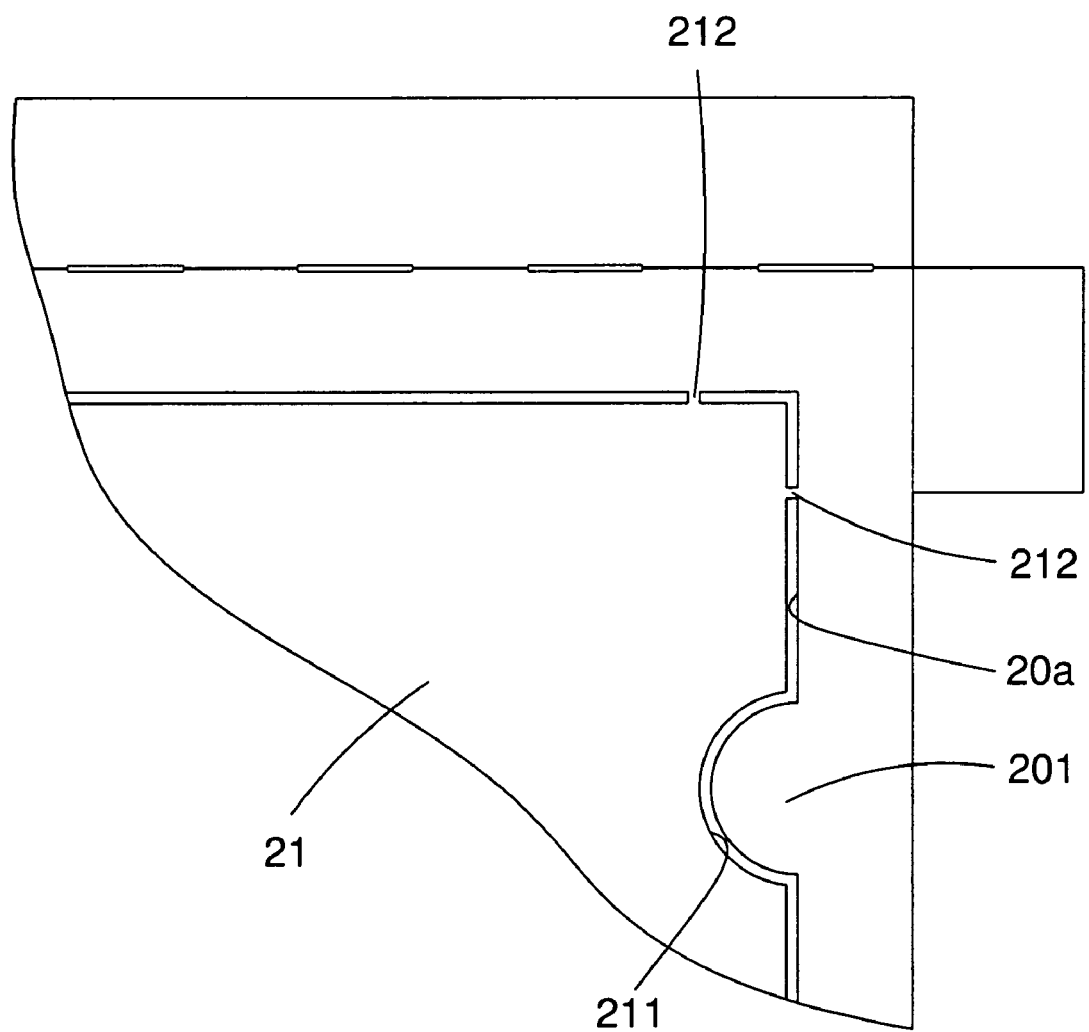
FIG. 3 is the partially enlarged view of FIG. 2.

As shown in FIG. 3, a notch 211 is formed on one side of the cover 21 for accommodating the second protrusive block 201. In addition, the cover 21 is connected with the window 20a by a plurality of connecting members 212 which connect with edges of the cover 21 and inner edges of the window 20a. Because the connecting members 212 are slight and delicate, the cover 21 is easily torn off or removed from the window 20a.

Figure 4:
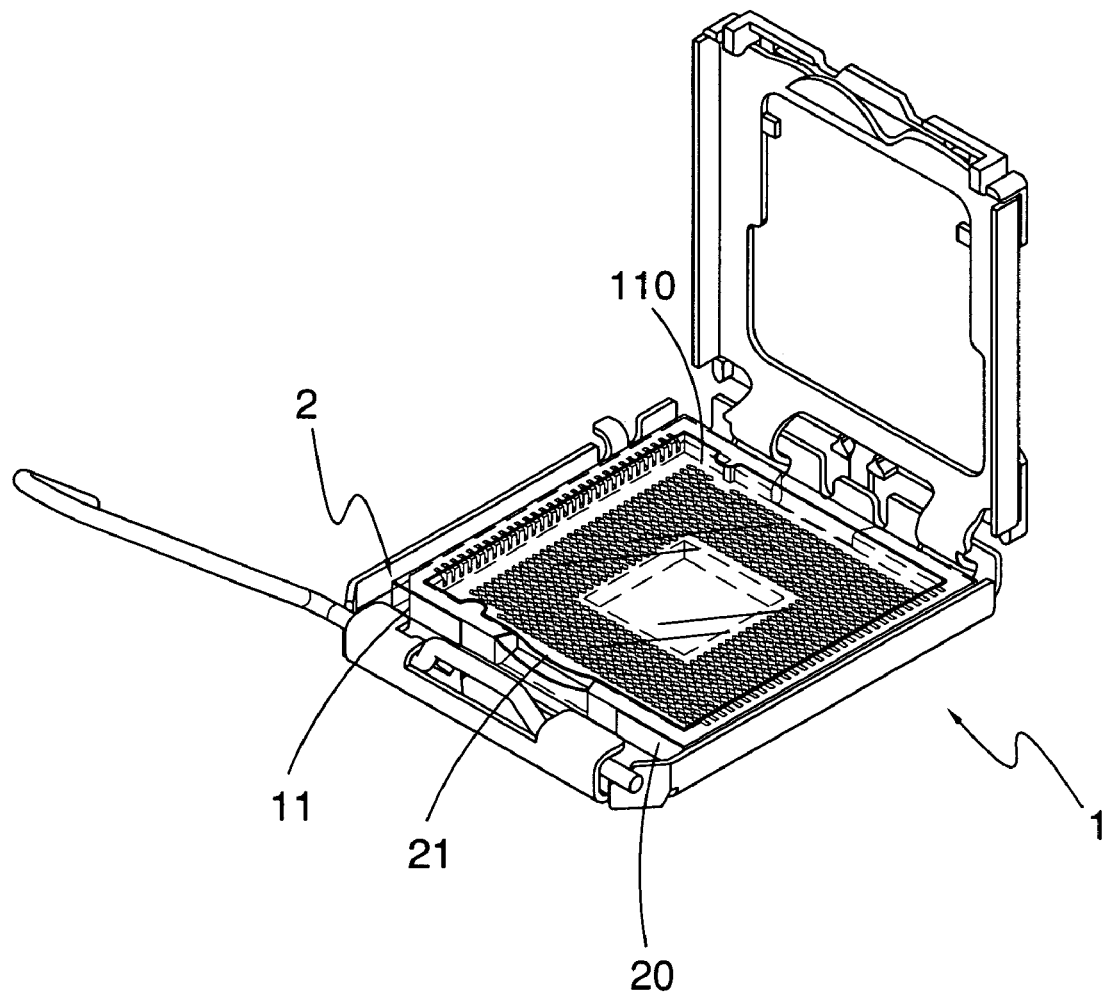
FIG. 4 shows a perspective view depicting the socket module of the present invention wherein cover is connected to the protective cap.

FIG. 4 shows the protective cap 2 is covered and adhered to the peripheral of the socket 11. In this manner, even though the socket 11 is covered, the condition of the electric region 11 is still visible and clear for consumers because the protective cap 2 is transparent. That is, the consumers are able to inspect the condition of the electric region 110 so as to determine the quality of the socket 11. Meanwhile, the protective cap 2 prevents the consumers from touching the electric region 110 that ensures the electric region 110 of the socket 11 is well protected and will not be damaged. In particular, the sellers are able to verify whether the consumers have touched or damaged the electric region 110 of the socket 11 by inspecting the completeness of the protective cap 2, such as checking whether the cover 21 has been off or the frame 20 is remained in a proper position.

Figure 5:
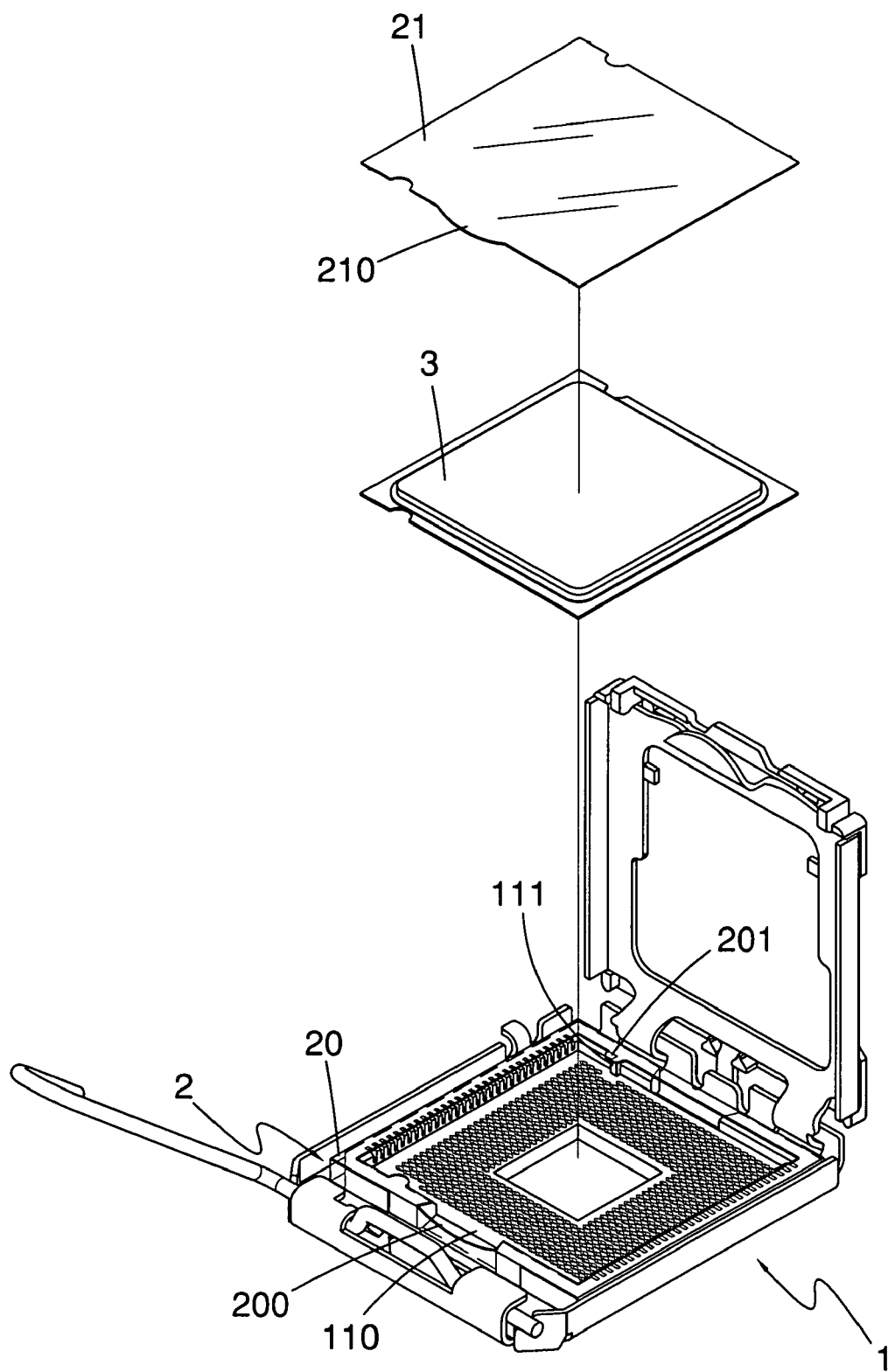
FIG. 5 shows a perspective view depicting the socket module of the present invention wherein cover is separated from the protective cap.
Figure 5A:
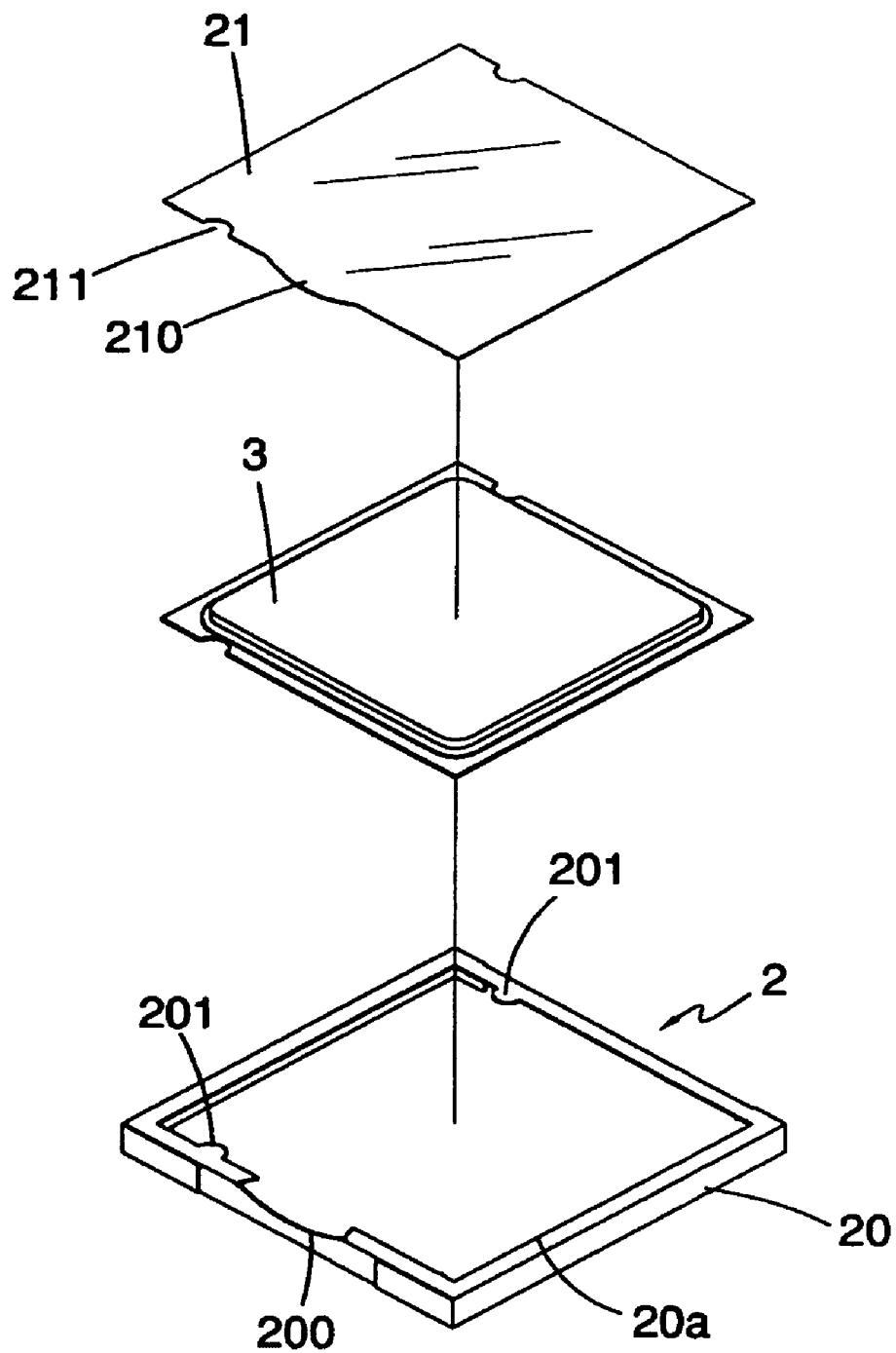
FIG. 5A is an exploded view of the protective cap of FIG. 5.

FIGS. 5 and 5A show the cover 21 separated from the frame 20. The electric region 110 is exposed such that an Intel LGA775 CPU 3 can be placed onto the socket 11. The notch 200 and the protrusive member 201 facilitate a user to tear off the cover 21. Further, even though one of the first foolproof protrusive blocks 111 is smaller than the second foolproof protrusive block 201 above, the user is able to correctly install the Intel LGA775 CPU 3 onto the socket 11 the assistance of the second foolproof protrusive block 201.

Figure 6:
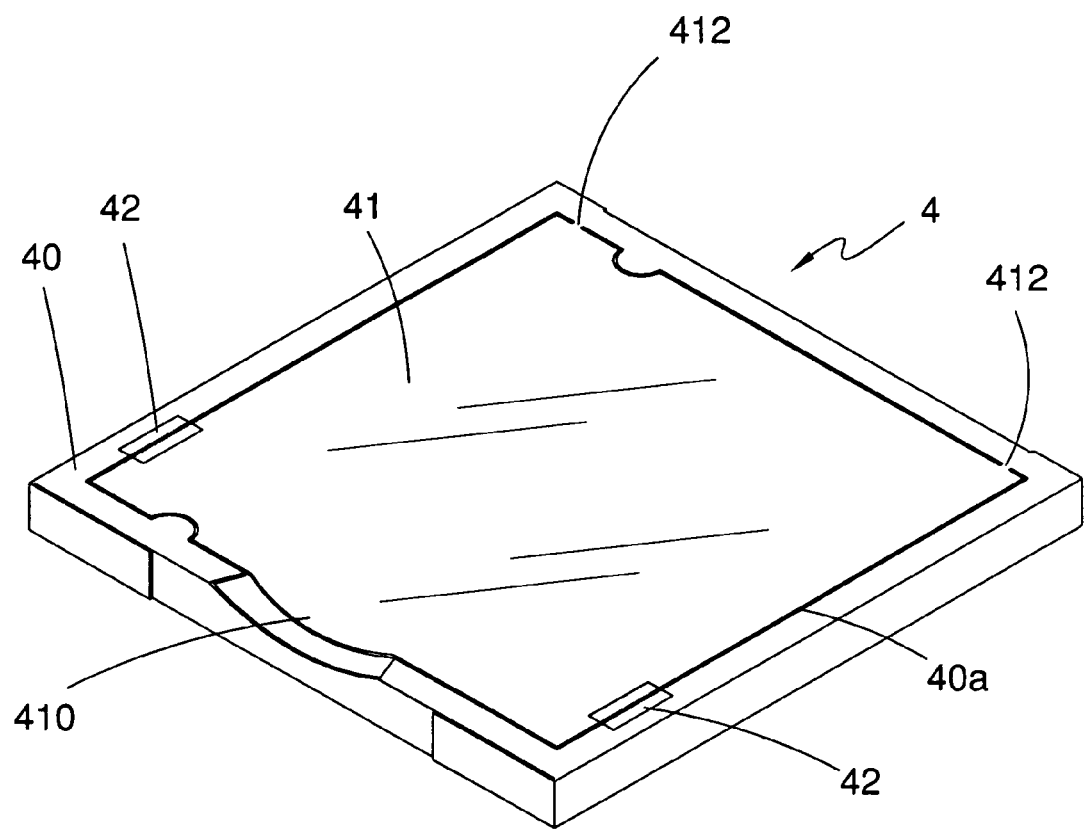
FIG. 6 shows another embodiment of the protective cap of the present invention.
Figure 7:
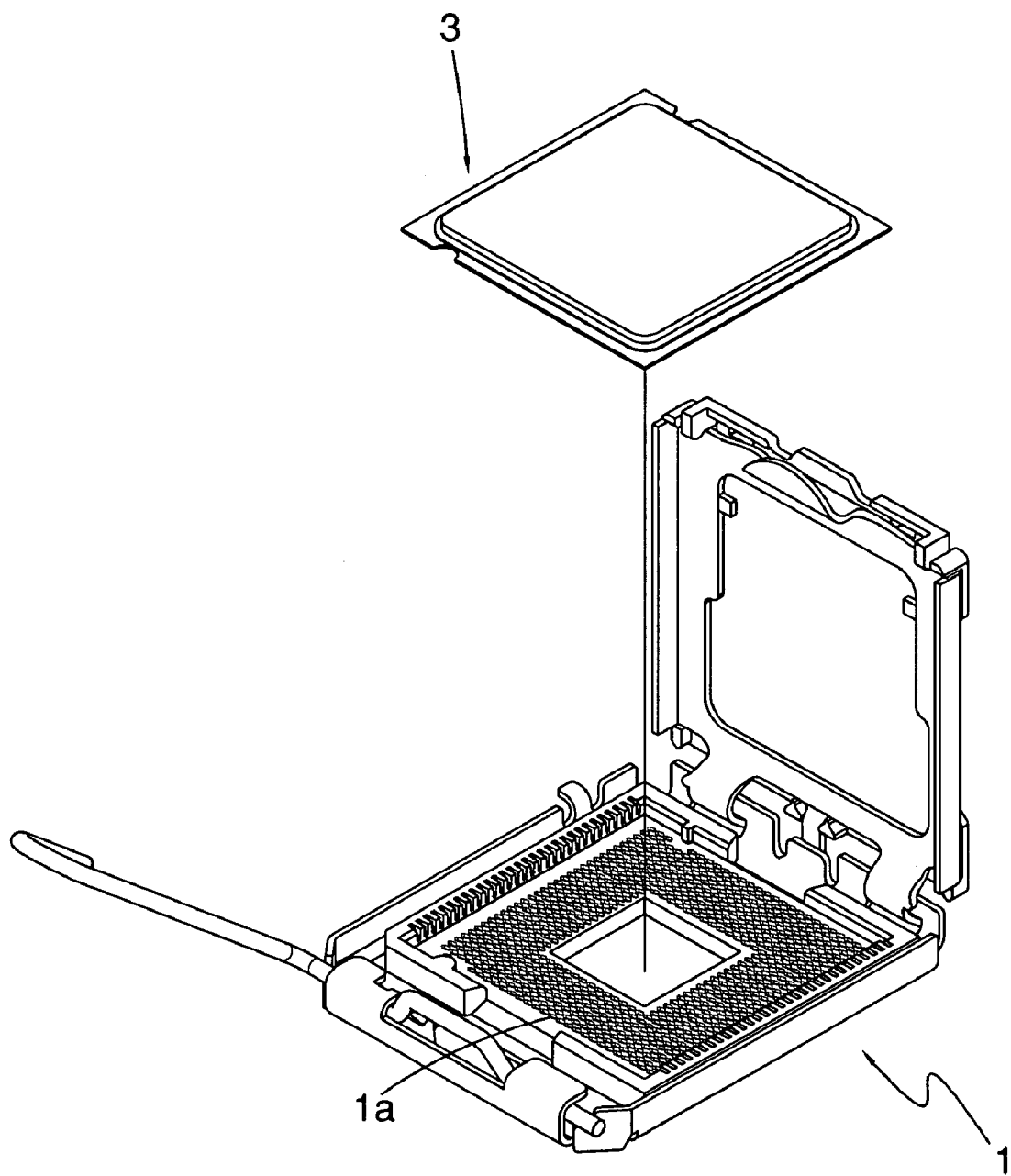
FIG. 7 shows a conventional Intel LGA775 CPU and a Socket 775.

FIG. 6 shows another embodiment of the present invention. A protective cap 4 is provided for replacing the above-mentioned protective cap 2. Like the protective cap 2, the protective cap 4 includes a frame 40, a window 40a and a cover 41. Additionally, a protrusive member 410 is provided on a side of the cover 41 and an opposite side of the cover 41 has a plurality of connecting members 412 provided for connecting the cover 41 to an inner edge of the window 40a. In this manner, the cover 41 can be opened and closed by the protrusive member 410 and the connecting members 412 is provided as a pivot.

In addition, two pieces of cheat-proof stickers 42 are stuck to both of the frame 40 and the cover 41, respectively. Once the cover 41 is removed, the cheat-proof stickers 42 are incomplete. Therefore, checking the completeness of the cheat-proof stickers 42 determine whether the user has touched or damaged the electric region 110.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

I claim:

1. A CPU socket module, comprising:
   a socket, having an electric region for electronically connecting a CPU; and
   a protective cap for covering the socket, the protective cap including a frame and a transparent cover, wherein the frame surrounds the electric region and includes a window formed for showing the electric region,
   wherein the transparent cover is disposed within the window and is removably attached to the frame, the transparent cover being able to be torn off from the frame.

2. The CPU socket module according to claim 1, further comprises a holder for supporting the socket and fixing the CPU electronically connected to the socket.

3. The CPU socket module according to claim 1, wherein the frame further comprises a notch closely adjacent to the cover.

4. The CPU socket module according to claim 3, wherein the cover includes a protrusive member which is formed to a side of the cover and faces the notch for inserting into the notch.

5. The CPU socket module according to claim 1, wherein the socket further comprises a first foolproof protrusive block extending to be adjacent to the electric region, and wherein the frame further comprises a second foolproof protrusive block corresponding to the first foolproof protrusive block, the second foolproof protrusive block covering the first foolproof protrusive block, the cover further comprising a notch for accommodating the second foolproof protrusive block.

6. The CPU socket module according to claim 1, wherein the cover further includes a plurality of connecting members connecting with the window.

7. The CPU socket module according to claim 1, further comprises a cheat-proof sticker for sticking both of the frame and the cover.

8. The CPU socket module according to claim 6, further comprises a cheat-proof sticker for sticking both of the frame and the cover.

9. A protective cap, formed from a transparent plastic sheet, comprising:
   a frame, having a window, the transparent plastic sheet having a plurality of foldable members folded to form the frame, and
   a cover provided within the window and including a plurality of connecting members connecting with the window to join the cover to the frame.

10. The protective cap according to claim 9, wherein the frame further comprises a notch closely adjacent to the cover.

11. The protective cap according to claim 10, wherein the cover further comprises a protrusive member for inserting into the notch.

12. The protective cap according to claim 9, wherein the window further comprises a foolproof protrusive block protruding toward the cover, and the cover further comprises a notch for receiving the foolproof protrusive block.

13. The protective cap according to claim 11, wherein the window further comprises a foolproof protrusive block protruding toward the cover, and the cover further comprises a notch for receiving the foolproof protrusive block.

* * * * *